(12) United States Patent
Yoshioka et al.

(10) Patent No.: US 7,750,448 B2
(45) Date of Patent: Jul. 6, 2010

(54) SEMICONDUCTOR PACKAGE AND METHOD FOR MANUFACTURING THE SAME

(75) Inventors: Shimpei Yoshioka, Yokohama (JP); Naotake Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/237,639

(22) Filed: Sep. 25, 2008

(65) Prior Publication Data

US 2009/0079046 A1 Mar. 26, 2009

(30) Foreign Application Priority Data

Sep. 26, 2007 (JP) ............................. 2007-250134

(51) Int. Cl.
*H01L 23/495* (2006.01)

(52) U.S. Cl. .................. 257/676; 257/666; 257/667; 257/668; 257/673; 257/674; 257/502; 257/E23.031; 257/E23.045; 257/E21.151

(58) Field of Classification Search ............... 257/500, 257/502, 522, 666–668, 673, 674, 676, E23.031, 257/E23.045, E21.151
See application file for complete search history.

(56) References Cited

U.S. PATENT DOCUMENTS 7,145,254 B2 * 12/2006 Hirano et al. ............... 257/796
2006/0164813 A1 * 7/2006 Yoshioka et al. ............ 361/717

FOREIGN PATENT DOCUMENTS

JP    2002-164485    6/2002
JP    2003-110064    4/2003

* cited by examiner

*Primary Examiner*—Marcos D Pizarro
*Assistant Examiner*—Raj Gupta
(74) *Attorney, Agent, or Firm*—Oblon, Spivak, McClelland, Maier & Neustadt, L.L.P.

(57) ABSTRACT

A semiconductor package includes a semiconductor device having a first main surface and a second main surface, a first electrode plate provided on the first main surface, a second electrode plate provided on the second main surface, and a wiring substrate provided between the semiconductor device and the first electrode plate, in which a plurality of opening portions in the side surface of a protruding portion provided on the first electrode plate are engaged respectively with a plurality of engaging portions which face the opening portions and which are provided on the inner side surface of an intrusion opening portion in the wiring substrate into which the protruding portion is intruded.

2 Claims, 9 Drawing Sheets

SEMICONDUCTOR PACKAGE AND METHOD FOR MANUFACTURING THE SAME

CROSS-REFERENCE TO RELATED APPLICATIONS

This application is based upon and claims the benefit of priority from prior Japanese Patent Application No. 2007-250134, filed Sep. 26, 2007, the entire contents of which are incorporated herein by reference.

BACKGROUND OF THE INVENTION

1. Field of the Invention

The present invention relates to a semiconductor package and a method for manufacturing the same.

2. Description of the Related Art

Presently, semiconductor devices such as an insulated gate bipolar transistor (IGBT) and an injection enhanced gate transistor (IEGT), and a metal oxide semiconductor field effect transistor (MOSFET) are being used as a power semiconductor device. The semiconductor device is formed in a sheet-like shape. The semiconductor device includes an upper surface side power terminal and a control terminal on its upper surface. It also has a back surface side power terminal on its back surface side.

Note that if the semiconductor device is an IGBT device, the upper surface side power terminal is an emitter electrode, the back surface side power terminal is a collector electrode, and the control terminal is a gate electrode.

To mount such a semiconductor device onto a substrate so as to provide a semiconductor package, the back surface side power terminal of the semiconductor device is connected to an electrode on the upper surface side of the substrate by solder jointing as described in, for example, Jpn. Pat. Appln. KOKAI Publication Nos. 2002-164485 and 2003-110064. Further, the upper surface side power terminal and the control terminal of the semiconductor device are connected to electrodes on the upper surface side of the substrate by wire bonding using an aluminum wire.

However, in the case of using wire bonding to connect a semiconductor device and substrate electrodes, wires are bonded one at a time, and so the bonding process takes time. It may thus lead to an increase in manufacturing cost for connection between a semiconductor device and electrodes. In the wire bonding, the wire has a loop-like form, thus has a long wire length, which fact may bring about an increase in inductance of interconnections and outer size of the device. Moreover, if vibration applied to the semiconductor device, there is a possibility that the wire may be disconnected or come in contact with an adjacent wire, etc., thus leading to a short-circuit.

To solve those problems, in place of the method of bonding a wire to the upper surface side power terminal of a semiconductor device, such a method is being used as to bond an aluminum thin plate, etc., or join a flat plate or a lead by soldering and lead it out as an electrode.

In a semiconductor module including a plurality of such the semiconductor devices, such the semiconductor packages are arranged in line on a substrate, which acts as a radiator plate. In this case, the back surface of the semiconductor package is jointed onto the substrate. This semiconductor module is installed in a power control device such as an inverter or a converter.

In this semiconductor module, only one surface of each of the semiconductor packages is in contact with the substrate, so that heat cannot be radiated sufficiently. Further, due to the constitution in which the back surface of the plate of each semiconductor package is jointed onto the substrate, an area in which the semiconductor packages are installed becomes large with respect to the area of the substrate. That is, it may lead to an increase in size of the semiconductor module.

To prevent those, according to a known method, first the semiconductor packages are arranged in a line. Next, those semiconductor packages are sandwiched vertically between a pair of conductive members such as bus bars, and are installed on the substrate.

However, the pair of conductive members have thermal conductivity and so such members also act as heat-radiation members. Therefore, the conductive members thermally expand as they are supplied with a current and then contract. In addition, the end of the conductor member on the side of the substrate is fixed and the other end thereof is free. Accordingly, the conductor member thermally expands and contracts differently between the free end and the fixed end thereof. In particular, the conductive member thermally expands and contracts at its free end greater than it does at the other end. This behavior may apply an external force on the semiconductor packages, thus damaging them.

Further, in order to reduce the size of the semiconductor package, the connection portion of each of the terminals of the semiconductor device must also be reduced in size. Therefore, in the method of manufacturing the semiconductor packages, they cannot be jointed satisfactorily in some cases. This may easily cause damage to the jointing portions.

To prevent such damage, such a method is available as to increase the jointing area or joint not only one surface but also the side surfaces consistently by using solder (or adhesive agent etc.) for the purpose of sufficient jointing. However, such method may lead to an increase in number of soldering positions and also in number of assembly processes such as processes of soldering, installing of spacers, and welding, etc. Such an increase in the number of the assembly processes may bring about an increase in mass production costs.

BRIEF SUMMARY OF THE INVENTION

In order to solve the problem and achieve the object, a semiconductor package of the present invention comprises: a plate-shaped semiconductor device having a gate electrode provided at a midsection of a first main surface, an emitter electrode provided around the gate electrode on the first main surface, and a collector electrode provided on a second main surface; a plate-shaped first electrode plate having a protruding portion which is provided on one of surfaces facing the first main surface and which abuts against at least part of the emitter electrode, a through-hole formed at a center of the protruding portion, a pedestal portion which forms part of an inner peripheral surface of the through-hole and which is provided on the other surface side, a communication path formed in the protruding portion and extending from the through-hole up to an outer side surface of the protruding portion, and a plurality of opening portions formed in the outer side surface of the protruding portion; a wiring substrate stacked between the semiconductor device and the first electrode plate, formed like a plate which can be sandwiched, and having an intrusion opening portion into which the protruding portion is intruded, a projecting portion whose base end is provided on an inner peripheral surface of the intrusion opening portion, whose tip is positioned within the through-hole and held on the pedestal portion, and which extends through the communicating path, a control electrode provided on the tip of the projecting portion and electrically connected to the gate electrode, and a plurality of engaging portions which are formed in the inner peripheral surface of the intrusion opening portion and engaged with said plurality of opening portions and whose tips are positioned inside the outer side surface of the protruding portion; and a plate-shaped second electrode whose one main surface is electrically connected to the collector electrode.

In order to solve the problem and achieve the object, a semiconductor package of the present invention may also comprise: a plate-shaped semiconductor device having a gate electrode provided at a midsection of a first main surface, an emitter electrode provided around the gate electrode on the first main surface, and a collector electrode provided on a second main surface; a plate-shaped first electrode plate having a protruding portion which is provided on an opposite surface facing the first main surface and which abuts against at least part of the emitter electrode, a through-hole formed at a center of the protruding portion, a pedestal portion which forms part of an inner peripheral surface of the through-hole and which is provided on the side of a surface facing the opposite surface, a communication path formed in the protruding portion and extending from the through-hole up to an outer side surface of the protruding portion, at least one opening portion which is formed in an outer side surface of the protruding portion and which partially runs through the outer side surface of the protruding portion, and a projecting grappling portion which forms the outer side surface of the protruding portion and which is provided on the opposite surface; a wiring substrate stacked between the semiconductor device and the first electrode plate, formed like a plate which can be sandwiched, and having an intrusion opening portion into which the protruding portion and the grappling portion are intruded, a projecting portion whose base end is provided on part of a peripheral surface of the intrusion opening portion, whose tip is positioned within the through-hole and held on the pedestal portion, and which extends through the communicating path, a control electrode provided on the tip of the projecting portion and electrically connected to the gate electrode, and an engaging portion which is formed in the inner peripheral surface of the intrusion opening portion and engaged with the opening portion and whose tip is positioned inside the outer side surface of the protruding portion; and a plate-shaped second electrode whose one main surface is electrically connected to the collector electrode.

In order to solve the problem and achieve the object, a semiconductor package manufacturing method of the present invention comprises the steps of: disposing a square-shaped first electrode plate having a protruding portion provided on one of its main surfaces and a plurality of opening portions formed in a side surface of the protruding portion and a wiring substrate having an intrusion opening portion into which the protruding portion is intruded and engaging portions which are engaged with said plurality of opening portions formed in an inner side surface of the intrusion opening portion and whose tips are positioned inside an outer side surface of the protruding portion, to a position where the opening portions and the engaging portions can be engaged with each other; mounting the wiring substrate and the first electrode plate to each other by engaging said plurality of engaging portions of the wiring substrate with said plurality of opening portions in the first electrode plate respectively; and jointing the wiring substrate and the first electrode plate mounted to each other and a semiconductor device having electrodes to each other by using a conductive member.

In order to solve the problem and achieve the object, a semiconductor package manufacturing method of the present invention may also comprise: disposing a square-shaped first electrode plate having a protruding portion provided on one of its main surfaces, a plurality of opening portions formed in at least one of side surfaces of the protruding portion, and a grappling portion provided on the side surface that faces the side surface of the protruding portion in which the opening portions are formed, and a wiring substrate having an intrusion opening portion into which the protruding portion and the grappling portion are intruded and engaging portions which are engaged with said plurality of opening portions formed in an inner side surface of the intrusion opening portion and whose tips are positioned inside an outer side surface of the protruding portion, to a position where the opening portions and the engaging portions can be engaged with each other; covering the side surface of the protruding portion with the inner side surface of the intrusion opening portion and causing said plurality of opening portions and said plurality of engaging portions to face each other respectively; engaging said plurality of opening portions and said plurality of engaging portions with each other respectively by moving said plurality of opening portions and said plurality of engaging portions facing each other respectively in such a direction that the opening portions and the engaging portions may be engaged with each other respectively; mounting the wiring substrate and the first electrode plate to each other by covering the side surfaces of the grappling portion and the protruding portion with the inner side surface of the intrusion opening portion; and jointing the wiring substrate and the first electrode plate mounted to each other and a semiconductor device having electrodes to each other by using a conductive member.

In order to solve the problem and achieve the object, a semiconductor package manufacturing method of the present invention comprises the steps of: disposing a square-shaped first electrode plate having a protruding portion provided on one of its main surfaces, a plurality of opening portions formed in at least one of side surfaces of the protruding portion, a grappling portion provided on the side surface that faces the side surface of the protruding portion in which the opening portions are formed, and an opening portion formed on a side surface of the grappling portion, and a wiring substrate having an intrusion opening portion into which the protruding portion and the grappling portion are intruded and engaging portions which are engaged with said plurality of opening portions formed in an inner side surface of the intrusion opening portion and whose tips are positioned inside outer side surfaces of the protruding portion and the grappling portion, to a position where the opening portions and the engaging portions can be engaged with each other; covering the side surface of the protruding portion with the inner side surface of the intrusion opening portion and causing said plurality of opening portions and said plurality of engaging portions to face each other respectively; engaging said plurality of opening portions of the protruding portion and said plurality of engaging portions with each other respectively by moving said plurality of opening portions and said plurality of engaging portions provided on the protruding portion facing each other respectively in such a direction that the opening portions of the protruding portion and the engaging portions may be engaged with each other respectively; mounting the wiring substrate and the first electrode plate to each other by covering the side surfaces of the grappling portion and the protruding portion with the inner side surface of the intrusion opening portion and engaging the engaging portions and the opening portions in the grappling portion with each other respectively; and jointing the wiring substrate and the first electrode plate mounted to each other and a semiconductor device having electrodes to each other by using a conductive member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL
VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
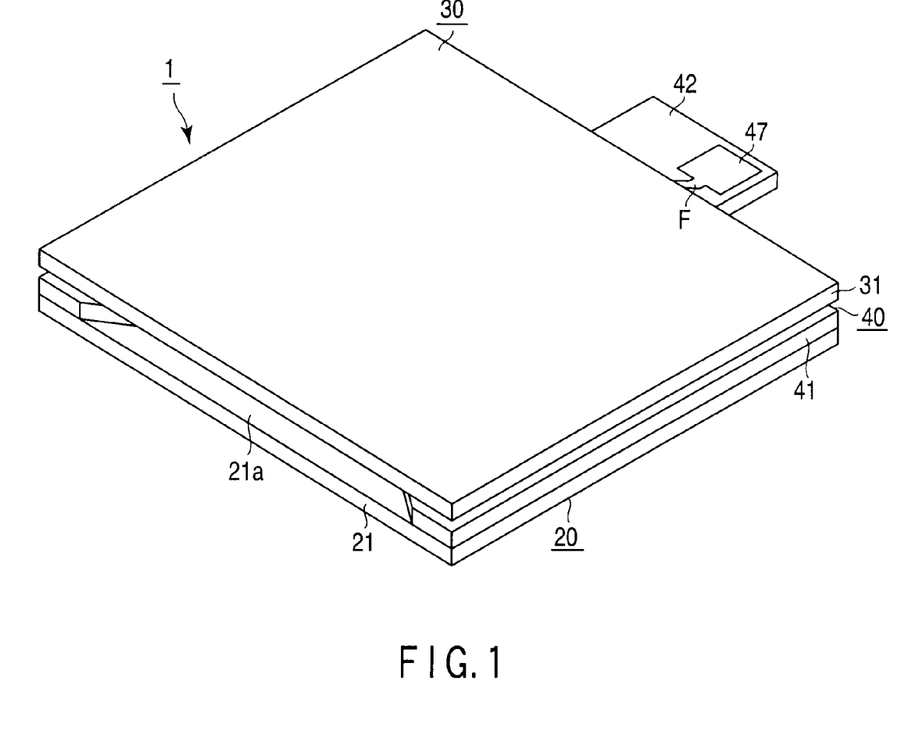
FIG. 1 is a perspective view of a semiconductor package according to a first embodiment of the invention.
Figure 2:
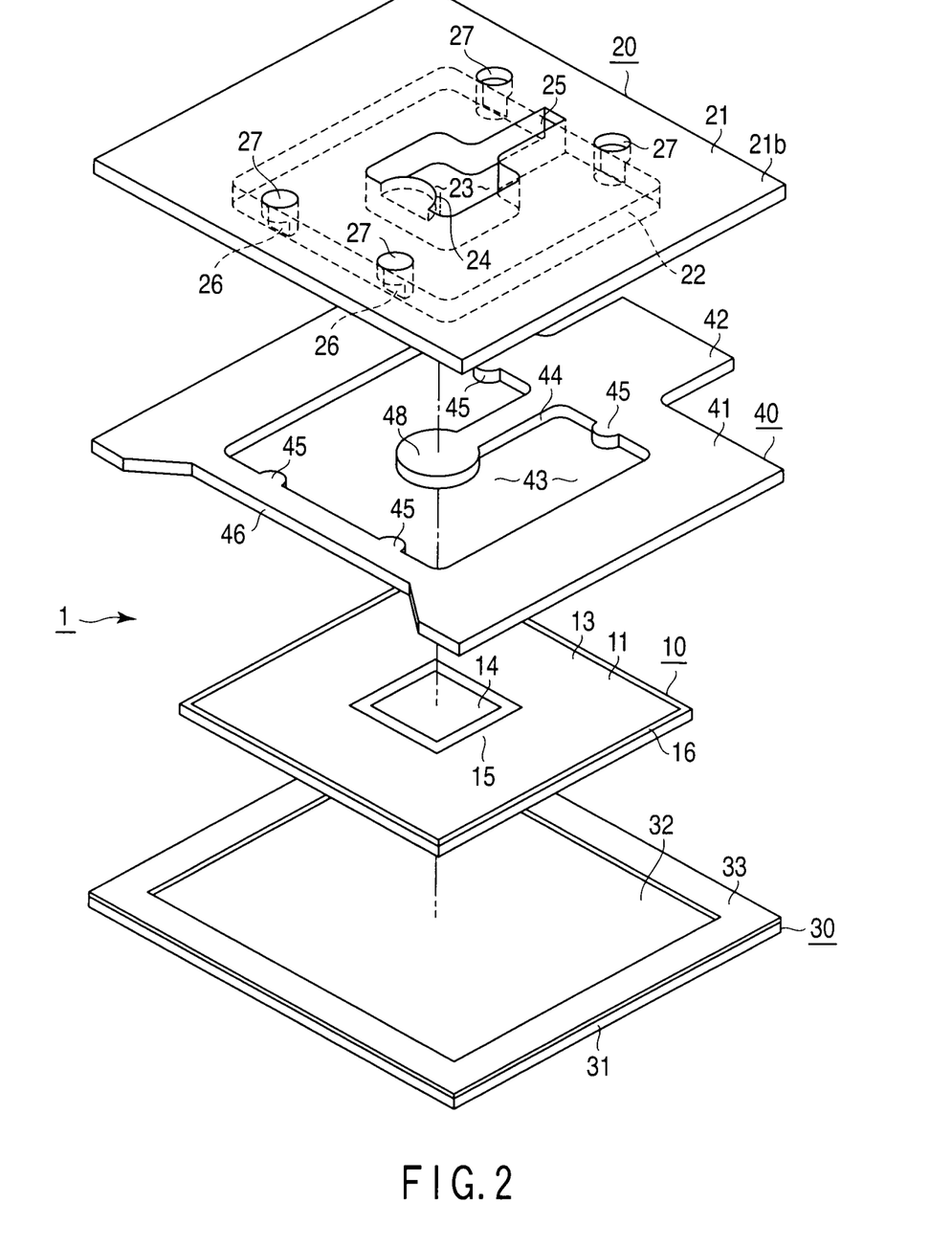
FIG. 2 is an exploded perspective view of a constitution of the same semiconductor package.
Figure 3:
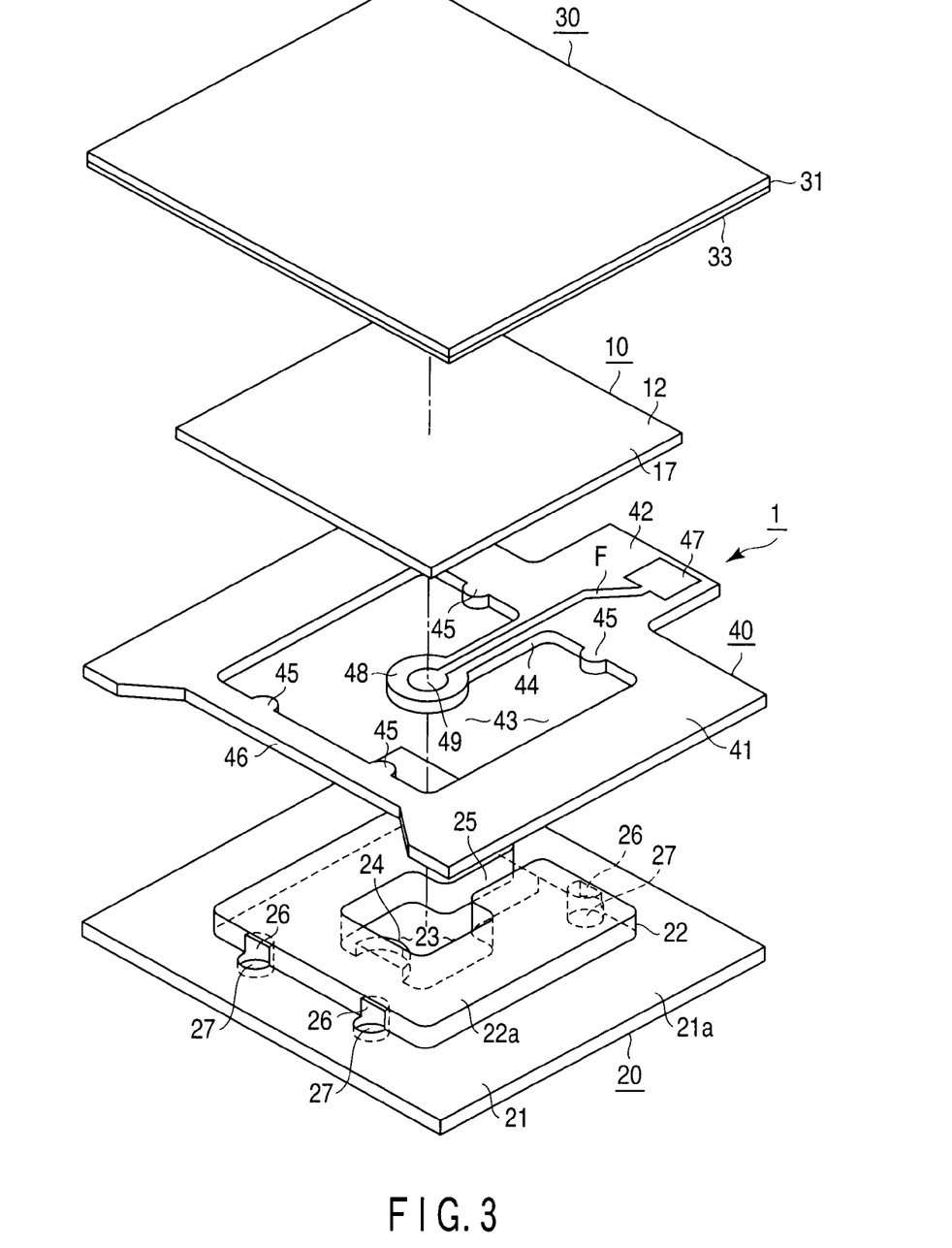
FIG. 3 is another exploded perspective view of the constitution of the same semiconductor package.

A semiconductor package 1 according to a first embodiment of the invention will be described below with reference to FIGS. 1 to 3. FIG. 1 is a perspective view of a semiconductor package 1 according to the first embodiment of the invention, FIG. 2 is an exploded perspective view of the constitution of the semiconductor package 1, and FIG. 3 is another exploded perspective view of the constitution of the semiconductor package 1. Note that "F" in FIGS. 1 to 3 indicates an interconnection.

As shown in FIGS. 1 to 3, the semiconductor package 1 includes a semiconductor device 10, a first electrode plate 20, a second electrode plate 30, and a wiring substrate 40. Note that in the semiconductor package 1, the first electrode plate 20 is placed on the side of a first main surface 11 and the second electrode plate 30 is placed on the side of a second main surface 12 of the semiconductor device 10. The semiconductor package 1 has the wiring substrate 40 between the semiconductor device 10 and the first electrode plate 20.

As can be seen from this, the semiconductor package 1 is constituted by stacking the first electrode plate 20, the wiring substrate 40, the semiconductor device 10, and the second electrode plate 30 in this order.

The semiconductor device 10 is made of a square-shaped small-piece plate-like semiconductor chip, for example, an IGBT device. Further, the semiconductor device 10 is shaped so that its outer peripheral edge may be inside the outer peripheral edge of each of the first electrode plate 20, the second electrode plate 30, and the wiring substrate 40. That is, the semiconductor device 10 has an outer shape that is smaller than those of the first electrode plate 20, the second electrode plate 30, and the wiring substrate 40.

The semiconductor device 10 has an emitter electrode 13 and a gate electrode 14 on its first main surface 11. The emitter electrode 13 is formed in a region between the outer peripheral edge and its central periphery of the first main surface 11. The gate electrode 14 is formed in a condition where it is enclosed by the emitter electrode 13 formed on the first main surface 11. That is, the gate electrode 14 is provided at the midsection of the first main surface 11.

Between the inner peripheral edge of the emitter electrode 13 and the outer peripheral edge of the gate electrode 14, a solder resistive film 15 is printed. The solder resistive film 15 is formed in such a manner that it can prevent short-circuiting caused by solder flowing from between the emitter electrode 13 and the gate electrode 14.

Further, on the outer periphery of the emitter electrode 13, a solder resistive film 16 is formed. The solder resistive film 16 is formed in such a manner that it can prevent solder from flowing out of the emitter electrode 13 at its end portion. On the other hand, on the second main surface 12, a collector electrode 17 is formed.

The first electrode plate 20 includes a first substrate body 21 and a protruding portion 22 formed on one surface 21a of the first substrate body 21. The first substrate body 21 is formed like a square-shaped plate by using a conductive material such as copper.

The protruding portion 22 has a joint surface 22a that is jointed to the emitter electrode 13 and has a square shape which is almost the same as that of the emitter electrode 13. The protruding portion 22 has a through-hole 23, a pedestal portion 24, a communicating path 25, and opening portions 26.

In more detail, the through-hole 23 is approximately square shaped and formed approximately at a central position of the protruding portion 22 where the gate electrode 14 is placed. The pedestal portion 24 is formed on the inner periphery of the through-hole 23 and on the side of the other surface 21b of the first substrate body 21.

The communicating path 25 is a through-hole that is formed from the through-hole 23 to the outer side surface of the protruding portion 22.

That is, due to the through-hole 23 and the communicating path 25, the joint surface 22a of the protruding portion 22, which surface is jointed to the emitter electrode 13, is formed as an approximately square-shaped letter C. On the other hand, the pedestal portion 24 is formed at a position on the inner surface of the through-hole 23 that faces the inner surface where the communicating path 25 is formed.

A plurality of the opening portions 26 are formed in the side surface of the protruding portion 22. The opening portion 26 is provided by forming a cylinder-shaped hole 27, for example, by pressuring by use of a mold, in the other surface 21b of the first substrate body 21, for example. Further, each of the opening portions 26 (two in the present embodiment) is formed in the mutually opposing outer side surfaces of the protruding portion 22 via the through-hole 23 and the outer side surface where the communicating path 25 is formed.

Note that this hole 27 does not run through the protruding portion 22. That is, the hole 27 is formed in the other surface 21b to such a depth that a thin wall may be left along its extension. Further, the hole 27 is formed so that its center may be positioned on the side surface of the protruding portion 22.

The second electrode plate 30 includes a second substrate body 31 that is formed as a square-shaped plate by using a conductive material such as copper. This second substrate body 31 includes a connecting surface 32 that faces the second main surface 12 and is connected to the collector electrode 17 and a solder resistive film 33 that is printed on the outer periphery of this connecting surface 32 and formed so that it can prevent solder from flowing (short-circuiting).

The wiring substrate 40 includes an insulating substrate 41 that is formed as an approximately square-shaped plate by using a glass epoxy resin or polyimide resin.

The insulating substrate 41 has a convex portion 42 formed at part of an outer periphery of this insulating substrate 41 and an intrusion opening portion 43 into which the protruding portion 22 is intruded. Further, the insulating substrate 41 includes a projecting portion 44, which is on an extension of the convex portion 42 and projects from the inner peripheral surface of the intrusion opening portion 43, and a plurality of engaging portions 45 that are formed on the inner peripheral surface of the intrusion opening portion 43 and correspond to the opening portions 26 respectively.

The insulating substrate 41 additionally has a notch 46 formed in its outer periphery that does not have the convex portion 42 on it and corresponds to the inner peripheral surface having the engaging portion 45 on the intrusion opening portion 43. That is, the notch 46 is formed on the side surface that faces the side surface of the insulating substrate 41 on which the convex portion 42 is formed.

The convex portion 42 has an external connection terminal 47 on the semiconductor device 10 side of a main surface of the convex portion 42.

The projecting portion 44 has a circular tip portion 48 on its end side. The tip portion 48 is so shaped as to enter the through-hole 23 formed in the protruding portion 22 when the first electrode plate 20 and the wiring substrate 40 are engaged. Further, on its surface that faces the semiconductor device 10, the tip portion 48 has a control electrode 49 that is electrically jointed to the gate electrode 14 by a conducting member such as solder (hereinafter referred to as "solder member") B. Note that this control electrode 49 is connected to the external connection terminal 47 by an interconnection F formed on the insulating substrate 41 by, for example, printing.

The engaging portion 45 is semicircular in shape and formed so that it can be deformed elastically. Further, the engaging portion 45 is formed so that it can be engaged with the opening portion 26 through elastic deformation. At least the tip of the engaging portion 45 is formed so that it may come inside the outer side surface of the protruding portion 22.

Note that the first electrode plate 20, the second electrode plate 30, and the insulating substrate 41 of the wiring substrate 40 are cast by, for example, pressing by using one progressive type die.

Next, processes for manufacturing such a semiconductor package 1 will be described below with reference to FIGS. 4 to 6.

Figure 4:
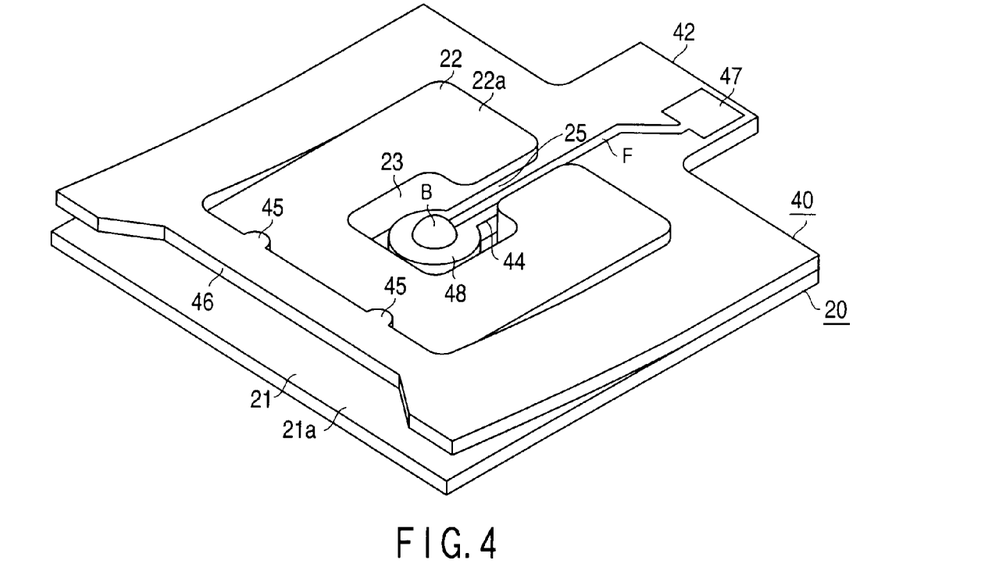
FIG. 4 is a perspective view of one example of assembling of a first electrode plate and a wiring substrate which are used in the same semiconductor package.

Note FIG. 4 is a perspective view of one example of assembling the first electrode plate 20 and the wiring substrate 40, which are used in the semiconductor package 1. FIG. 5 is a perspective view of another example of assembling of the first electrode plate 20 and the wiring substrate 40, which are used in the same semiconductor package 1, and FIG. 6 is a cross-sectional view of the constitution of the same semiconductor package 1.

Figure 5:
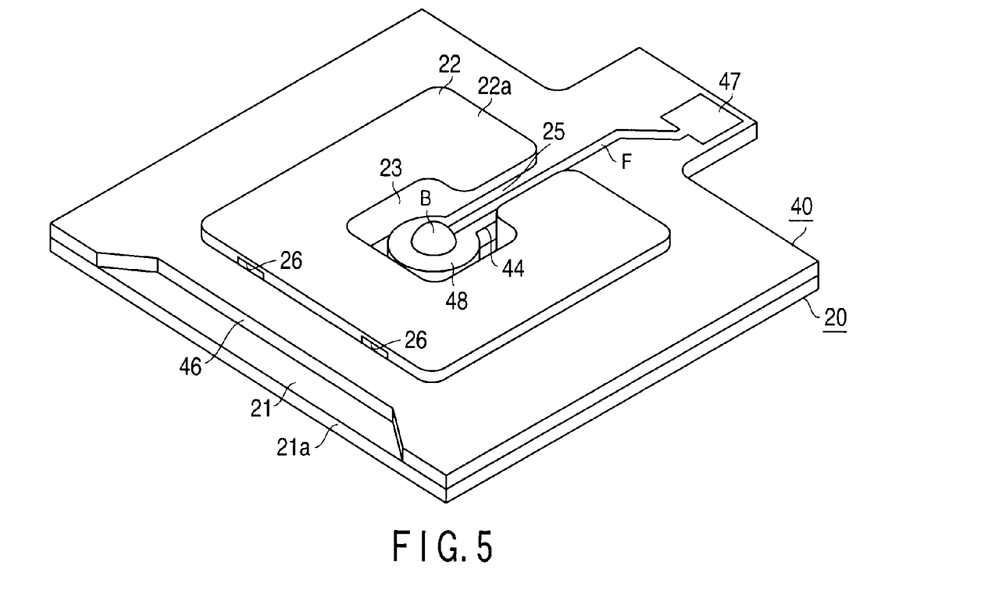
FIG. 5 is a perspective view of another example of assembling of the first electrode plate and the wiring substrate which are used in the same semiconductor package.

First, as shown in FIGS. 4 and 5, the first electrode plate 20 and the wiring substrate 40 are assembled. The solder member B is welded to the control electrode 49 of the wiring substrate 40. Note that in this case, the solder member B may be provided by adhesion or disposition rather than welding. Further, rather than providing the solder member B at this stage, it may be provided when the control electrode 49 and the gate electrode 14 are jointed to each other, which process will be described later.

Next, the first electrode plate 20 and the wiring substrate 40 are oriented and disposed so that the communicating path 25 and the projecting portion 44, and the through-hole 23 and the tip portion 48 may be aligned with each other respectively. In this condition, for example, the opening portions 26 (two opening portions 26) on the side where the communicating path 25 is formed are engaged with the engaging portions 45 (two engaging portions 45) on the side where the projecting portion 44 is formed. When they have been engaged with each other in such a manner, as shown in FIG. 4, above (the other) opening portion 26 not engaged yet (on the jointing surface 22a of the protruding portion 22), the other engaging portion 45 is placed.

In this condition, the periphery of the other engaging portion 45 is pressured or the periphery of the other engaging portion 45 (wiring substrate 40) is bent so that the engaging portion 45 may face the first substrate body 21. Accordingly, the other engaging portion 45 or its periphery is deformed elastically, so that the other engaging portion 45 is engaged with the other opening portion 26 corresponding to it. Note that by pressuring the peripheries of all the engaging portions 45 simultaneously, the engaging portions 45 may be deformed elastically and engaged with the respective opening portions 26.

If a pressure is applied to the periphery of the engaging portion 45, the wiring substrate 40 would move in a direction in which it may be approximately parallel with one surface 21a of the first substrate 21 and come closer to it. However, the surface that faces the first substrate body 21 of the engaging portion 45 abuts against the jointing surface 22a of the protruding portion 22. Therefore, the engaging portion 45 is pressured against the jointing surface 22a, so that the protruding portion 22 interferes with the protruding portion 45. Because the protruding portion 22 interferes with the engaging portion 45 in such a manner, the engaging portion 45 is bent.

In this condition, if the wiring substrate 40 is pressured further in such a direction as to come closer to one surface 21a, the engaging portion 45 slides on the side surface of the protruding portion 22 in a condition where the engaging portion 45 is bent. The engaging portion 45 continues sliding in such a manner until it comes to the opening portion 26, that is, the wiring substrate 40 moves until it approximately abuts against one surface 21a. If the wiring substrate 40 abuts against one surface 21a, the engaging portion 45 approaches the opening portion 26, so that when the engaging portion 45 enters the opening portion 26, the engaging portion 45 is released from interference and so restored to its original shape. In such a manner, the engaging portion 45 is engaged with the opening portion 26.

Note that if the periphery of the engaging portion 45 is bent so that the engaging portion 45 may face the first substrate body 21, the engaging portion 45 abuts against one surface 21a without interfering with the protruding portion 22. In this condition, if the periphery of the engaging portion 45 is released from bending, the engaging portion 45 is restored so as to be approximately parallel with one surface 21a and so enters the opening portion 26, thereby being engaged with it.

If the engaging portion 45 is engaged with the opening portion 26 in such a manner, the outer surface of the engaging portion 45 is covered with the opening portion 26. Accordingly, if the first electrode plate 20 and the wiring substrate 40 move in a direction in which they may separate from each other, at least either the outer surface of each engaging portion 45 interferes with the inner surface of each opening portion 26 or the outer side surface of the protruding portion 22 interferes with the inner side surface of the intrusion opening portion 43 at one position. This interference prevents the wiring substrate 40 from separating from the first electrode plate 20.

In more detail, for example, in a horizontal direction with respect to the jointing surface 22a, the inner peripheral surface of the intrusion opening portion 43 abuts against the side surface of each of the protruding portions 22, thus causing the wiring substrate 40 to be engaged with the first electrode plate 20. Further, in a perpendicular direction with respect to the jointing surface 22a, the outer surface of the engaging portion 45 comes in contact with the inner surface of the opening portion 26, thus causing the wiring substrate 40 to be engaged with the first electrode plate 20. By thus engaging the first electrode plate 20 with the wiring substrate 40, it is possible to prevent the first electrode plate 20 and the wiring substrate 40 from separating from each other.

Figure 6:
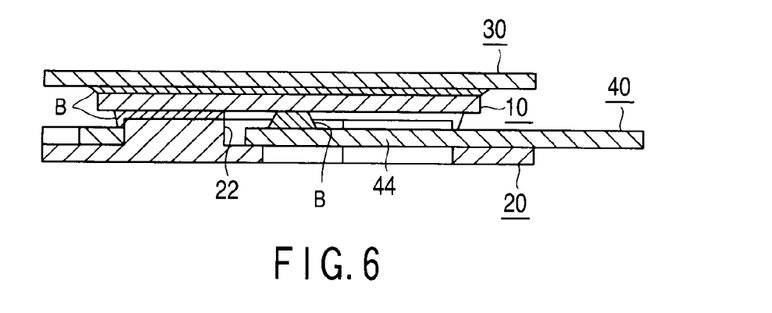
FIG. 6 is a cross-sectional view of a constitution of the same semiconductor package.

After the first electrode plate 20 and the wiring substrate 40 are engaged (assembled), as shown in FIG. 6, the solder member B is disposed on the jointing surface 22a and the side surface of the protruding portion 22. This solder member B may be, for example, a dish-shaped member or paste that covers the jointing surface 22a and the side surface of the protruding portion 22.

Next, the assembled first electrode plate 20 and wiring substrate 40 are jointed to the semiconductor device 10. In more detail, the protruding portion 22 and the control electrode 49 of the respective first electrode plate 20 and wiring substrate 40 on which the solder member B has been disposed are disposed so as to face the emitter electrode 13 and the gate electrode 14 respectively. The first electrode plate 20 and the wiring substrate 40 and the semiconductor device 10 are electrically jointed to each other by melting the solder member B in a condition where a predetermined pressure is applied on them. Thus, the protruding portion 22 is connected to the emitter electrode 13 and the control electrode 49 is connected to the gate electrode 14.

Next, the semiconductor device 10 and the second electrode plate 30 are jointed to each other. They are disposed so that the collector electrode 17 of the semiconductor device 10 may face the connecting surface 32 of the second electrode plate 30. In this condition, the solder member B is disposed in the solder resistive film 33 and melted, to electrically joint the semiconductor device 10 and the second electrode plate 30 to each other by applying a predetermined pressure on them.

In such a manner, the semiconductor device 10, the first electrode plate 20, the second electrode plate 30, and the wiring substrate 40 are electrically jointed using the solder member B and mechanically engaged using the engaging portions 45 and the opening portions 26. Thus, the semiconductor package 1 is formed as shown in FIG. 6.

In the thus constituted semiconductor package 1, the wiring substrate 40 is provided with the convex portion 42 that projects from the outer edge of another component, which convex portion 42 is provided thereon with the external connection terminal 47 to which the control electrode 49 is connected through the interconnection F. This external connection terminal 47 makes it possible to pull the interconnection of the control electrode 49 out of the package without wire bonding. That is, the semiconductor package 1 can be made small in external shape and enables the interconnection to on the exterior.

Further, by engaging the engaging portion 45 with the opening portion 26, the opening portion 26 and the engaging portion 45 interfere with each other and the intrusion opening portion 43 and the side surface of the protruding portion 22 interfere with each other, so that the first electrode plate 20 and the wiring substrate 40 are caught at the respective positions even if they move in such a direction as to separate from each other. Thus, the first electrode plate 20 and the wiring substrate 40 are securely engaged with and mounted to each other without separating from each other.

Further, by providing the wiring substrate 40 with the notch 46, a position on the insulating substrate 41 where the notch 46 has been formed can be easily deformed elastically. That is, when engaging the engaging portions 45 with the respective opening portions 26, the engaging portion 45 on the side where the notch 46 is formed is engaged finally, in which case the periphery of the engaging portion 45 of the insulating substrate 41 will be deformed easily. It is thus possible to easily mount the first electrode plate 20 and the wiring substrate 40 to each other.

Moreover, in order to engage the first electrode plate 20 and the wiring substrate 40 with each other, it is necessary only to engage the engaging portion 45 with the opening portion 26 without welding. Therefore, the first electrode plate 20 and the wiring substrate 40 can be assembled easily because they are engaged with each other without the need to weld or adhere them, for example.

This means that, for example, to mount the first electrode plate 20 and the wiring substrate 40 to each other by welding, at least two processes are required to, for example, first align the first electrode plate 20 and the wiring substrate 40 with each other and then weld them.

However, to assemble the semiconductor package 1, it is necessary only to engage the engaging portions 45 and the opening portions 26. That is, one process of assembling is enough to mount the first electrode plate 20 and the wiring substrate 40 to each other. This reduces the number of manufacturing (assembling) processes required, thereby reducing the manufacturing costs of the semiconductor package 1.

Further, the first electrode plate 20 and the wiring substrate 40 are structured so that they can be assembled at predetermined positions as they are guided by the shapes of the members such as the pedestal portion 24 and the tip portion 48 as well as the protruding portion 22 and the intrusion opening portion 43 that correspond to each other respectively. It is thus possible to prevent a mistake in assembly and a shift in position. Accordingly, the jointing surface 22a of the protruding portion 22 and the control electrode 49 are electrically connected securely to the emitter electrode 13 and the gate electrode 14 of the semiconductor device 10 respectively by using the solder member B, etc.

As described above, in the semiconductor package 1 according to the first embodiment, the first electrode plate 20 and the wiring substrate 40 can be mounted to each other securely without separating from each other, by intruding the protruding portion 22 into the intrusion opening portion 43 and engaging the engaging portions 45 with the respective opening portions 26. Further, as described above, solely by engaging the engaging portion 45 and the opening portion 26 with each other, they can be combined with each other, thereby reducing the number of manufacturing (assembling) processes required. This also enables reducing the manufacturing costs of the semiconductor packages. Also, by employing the constitution of the semiconductor package 1, they can be reduced in size.

Furthermore, the tip portion 48 is securely held by the pedestal portion 24 and fixed to the gate electrode 14 by the solder member B, so that it can be held at a predetermined position securely, thus improving the reliability also.

Next, a semiconductor package 1A according to a second embodiment of the invention will be described below with reference to FIGS. 7 to 12.

Figure 7:
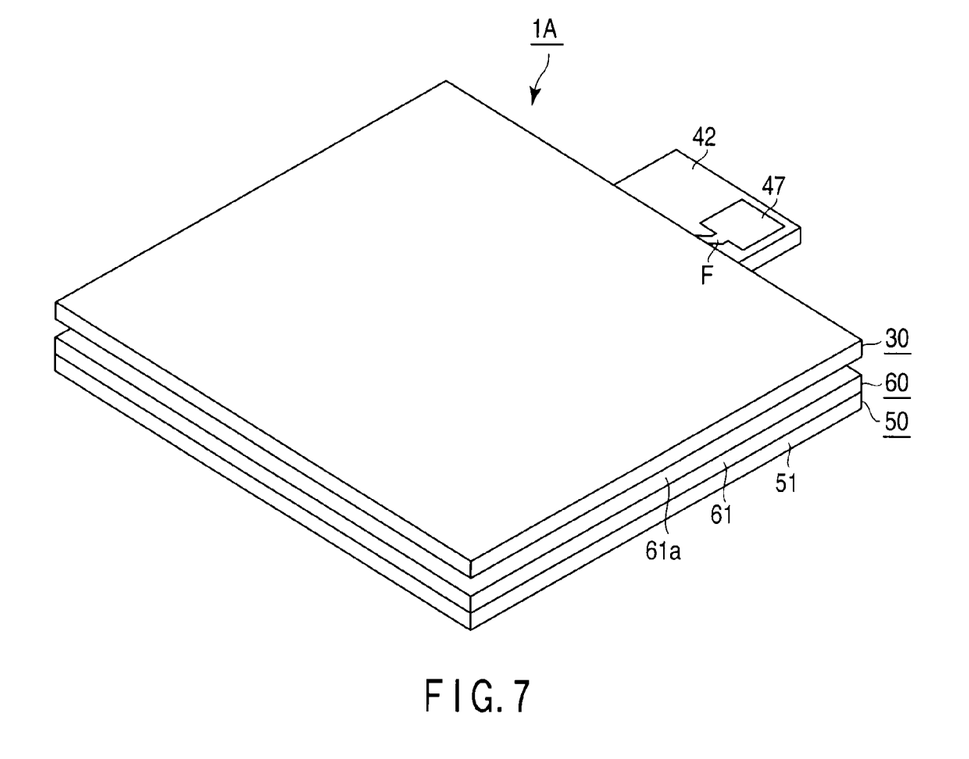
FIG. 7 is a perspective view of a semiconductor package according to a second embodiment of the invention.
Figure 8:
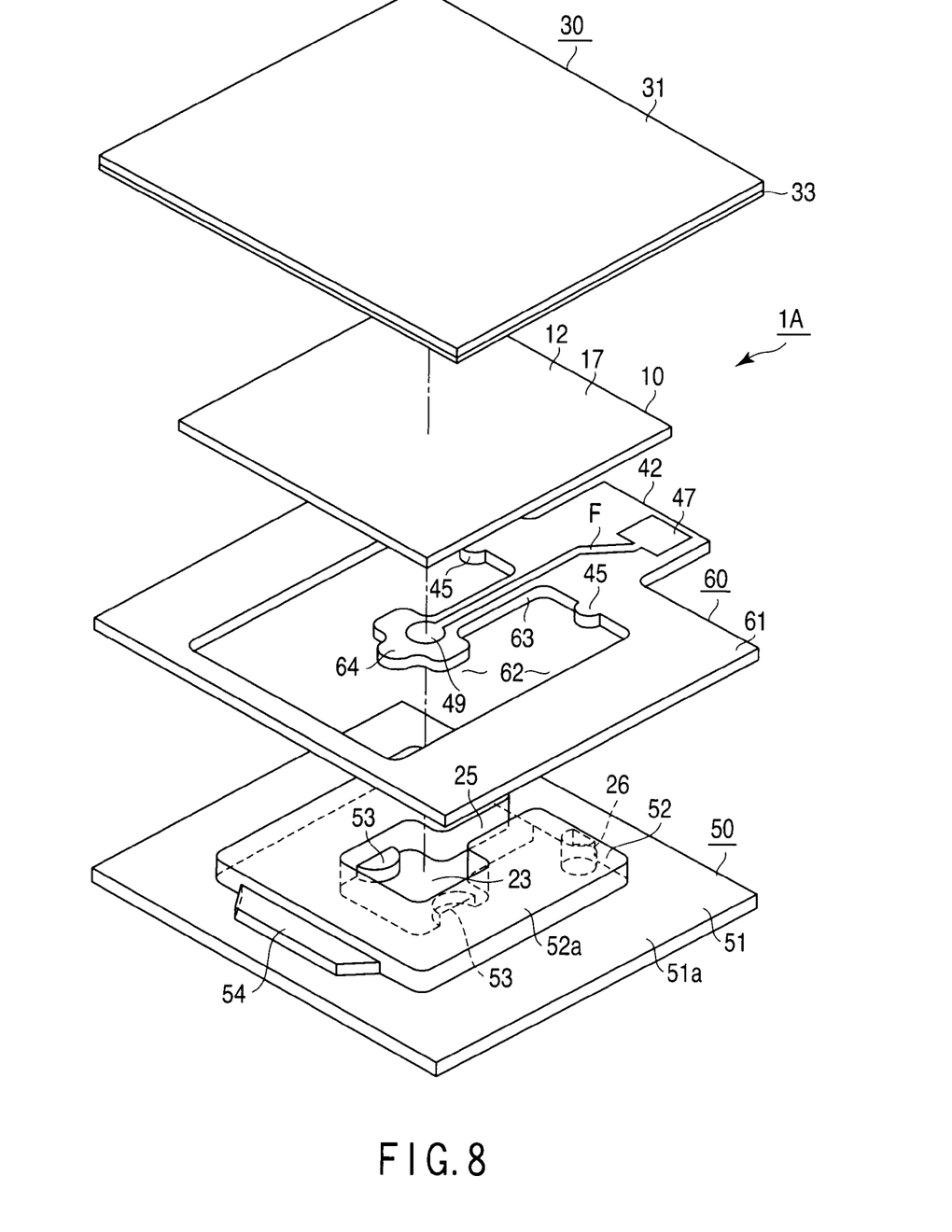
FIG. 8 is an exploded perspective view of a constitution of the same semiconductor package.
Figure 9:
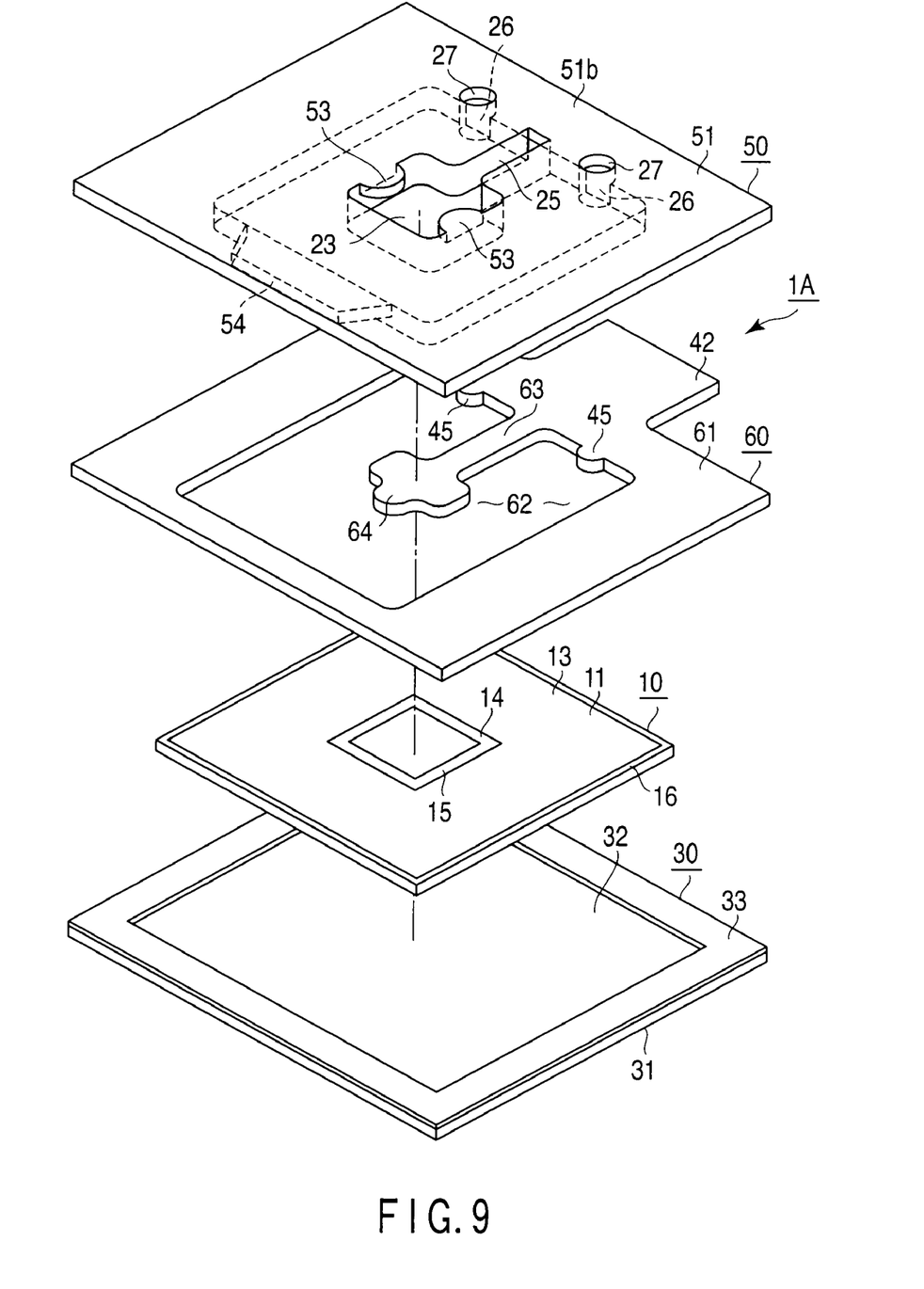
FIG. 9 is an exploded perspective view of another constitution of the same semiconductor package.

FIG. 7 is a perspective view of the semiconductor package 1A according to the second embodiment of the invention, FIG. 8 is an exploded perspective view of a constitution of the same semiconductor package 1A, and FIG. 9 is an exploded perspective view of another constitution of the same semiconductor package 1A. Note that in FIGS. 7 to 12, components having the same functions as those in FIGS. 1 to 6 are indicated by the same symbols and their detailed explanation will not be repeated here.

The semiconductor package 1A includes a semiconductor device 10, a first electrode plate 50 provided on the side of a first main surface 11, a second electrode plate 30 provided on the side of a second main surface 12, and a wiring substrate 60 provided between the semiconductor device 10 and the first electrode plate 50.

The first electrode plate 50 includes a first substrate body 51 and a protruding portion 52 placed on the first substrate body 51. The first substrate body 51 is formed as a square-shaped plate by using a conductive material such as copper. The protruding portion 52 is formed on one surface 51*a* of the first substrate body 51 and has a jointing surface 52*a* on its main surface.

The protruding portion 52 has a through-hole 23, pedestal portions 53, a communicating path 25, an opening portion 26, and a grappling portion 54. In more detail, the protruding portion 52 has the through-hole 23 that is approximately square shaped and formed approximately at a central position thereof and the mutually facing two pedestal portions 53 that are formed on the inner periphery of this through-hole 23 and on the other surface 51*b*. The protruding portion 52 further has the communicating path 25 which is formed from the through-hole 23 to the outer side surface of the protruding portion 52 and on whose extension the center position between the two pedestal portions 53 lies. Furthermore, the protruding portion 52 has a plurality of (two in FIGS. 8 and 9) opening portions 26 formed in its side surfaces on the side where this communicating path 25 is formed and the grappling portion 54 formed on such an outer side surface of the protruding portion 52 as to face the communicating path 25.

The grappling portion 54 is formed lower in height than the protruding portion 52. Further, a distance (width) of the grappling portion 54 as measured from its side surface on the side of the protruding portion 52 to its end surface is adjusted so that a total of the lengths of the grappling portion 54 and the protruding portion 52 may be equal to a length between the mutually facing inner surfaces of an intrusion opening 62 to be described later.

The wiring substrate 60 is mounted on an insulating substrate 61. Further, the wiring substrate 60 has the intrusion opening 62, a projecting portion 63, and an engaging portion 45. The intrusion opening 62 is formed so that the distance between its inner surfaces facing each other may be equal to the distance between the mutually facing outer surfaces of the grappling portion 54 and the protruding portion 52. That is, the intrusion opening 62 is formed so that the protruding portion 52 and the grappling portion 54 can be intruded therein.

A projecting portion 63 has a convex-shaped tip portion 64 at its tip. Further, the projecting portion 63 is formed so that it can be disposed in the communicating path 25. The engaging portions 45 are formed to positions on the inner side surface of the intrusion opening 62 on the side of the projecting portion 63 where they correspond to the respective opening portions 26 as many as the number of the opening portions 26. Note that the tip portion 64 has a control electrode 49.

Next, a method of manufacturing such a semiconductor package 1A will be described below with reference to FIGS. 10-12.

Figure 10:
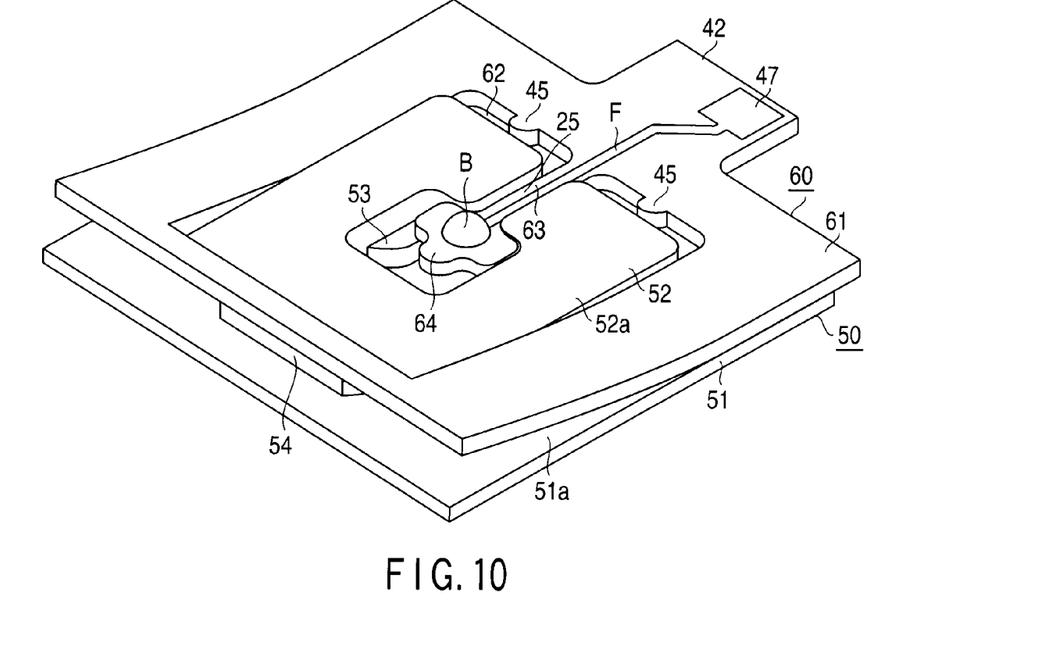
FIG. 10 is a perspective view of one example of assembling a first electrode plate and a wiring substrate which are used in the same semiconductor package.
Figure 11:
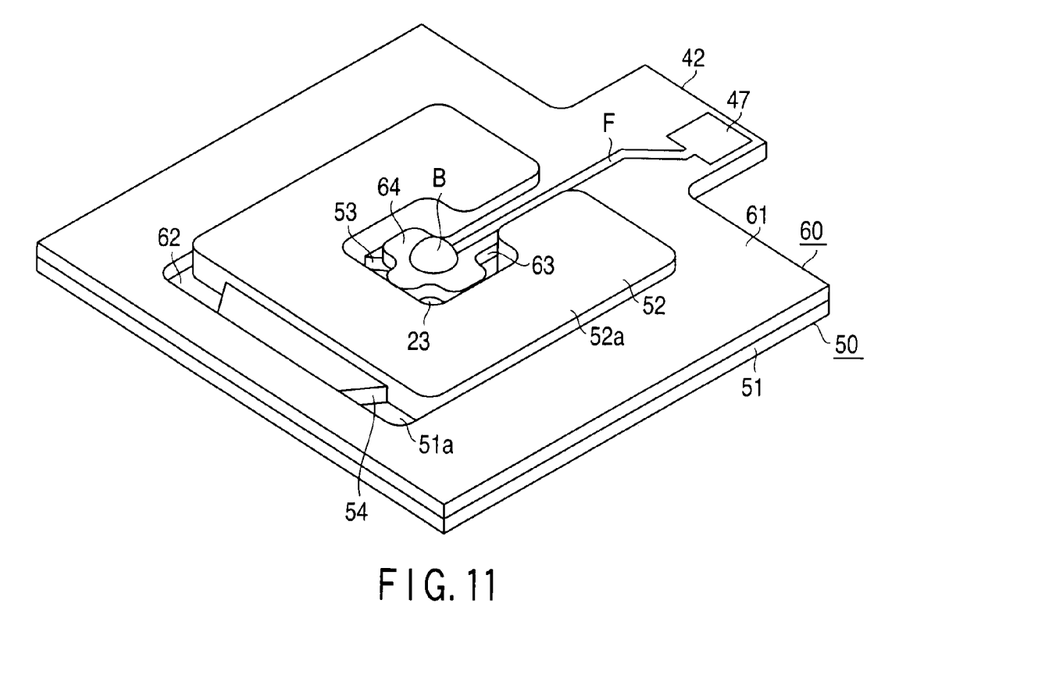
FIG. 11 is a perspective view of another example of assembling the first electrode plate and the wiring substrate which are used in the same semiconductor package.
Figure 12:
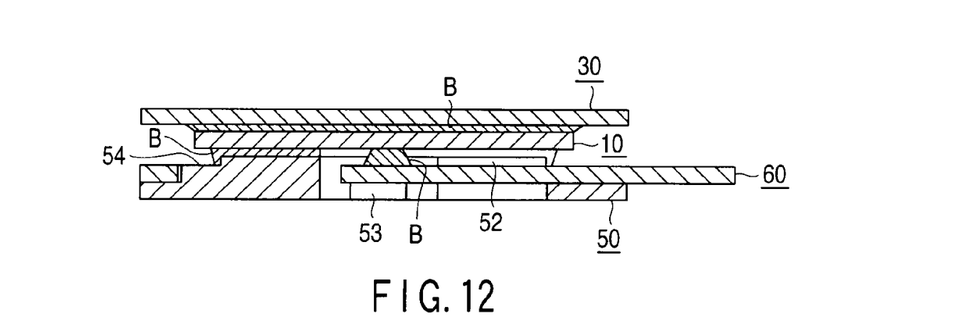
FIG. 12 is a cross-sectional view of a constitution of the same semiconductor package.

FIG. 10 is a perspective view of one example of assembling the first electrode plate 50 and the wiring substrate 60 which are used in the same semiconductor package 1A, FIG. 11 is a perspective view of another example of assembling the first electrode plate 50 and the wiring substrate 60 which are used in the same semiconductor package 1A, and FIG. 12 is a cross-sectional view of a constitution of the same semiconductor package 1A.

As shown in FIG. 10, the first electrode plate 50 and the wiring substrate 60 are assembled (mounted to each other). First, the first electrode plate 50 and the wiring substrate 60 are oriented and disposed so that the communicating path 25 and the projecting portion 63, and the through-hole 23 and the tip portion 64 may be aligned with each other respectively. Next, in this condition, the outer side surface of the protruding portion 52 on which the grappling portion 54 is formed and the corresponding inner side surface of the intrusion opening 62 are brought closer to each other and then the wiring substrate 60 is stacked on the first electrode plate 50. Since the instruction opening 62 is formed longer than the protruding portion 52 in the direction of the grappling portion 54, the engaging portion 45 is stacked on one surface 51*a* of the first substrate body 51.

In this condition, the wiring substrate 60 is slid in such a direction that it may be separated from the outer side surface of the protruding portion 52 on the side of the grappling portion 54, that is, the engaging portions 45 are engaged with the opening portions 26. When this wiring substrate 60 is being slid in such a manner, the insulating substrate 61 is held bent (deformed elastically) by as much as the thickness of the grappling portion 54. Further, since the sliding-directional length of the intrusion opening 62 is formed so as to be approximately equal to the total of the lengths of the protruding portion 52 and the grappling portion 54, if the engaging portions 45 are engaged with the opening portions 26, the inner side surface of the intrusion opening 62 is released from the grappling portion 54. Therefore, as shown in FIG. 11, due to the restoring force of the bent wiring substrate 60, the lower surface of the wiring substrate 60 abuts against one surface 51*a* of the first electrode plate 50.

If the engaging portions 45 have been engaged with the opening portions 26 so that the lower surface of the wiring substrate 60 may abut against the upper surface of the first electrode plate 50, the outer surface of each engaging portion 45 is covered with the opening portion 26. Further, the side surfaces of the protruding portion 52 and the grappling portion 54 are covered with the inner peripheral surface of the intrusion opening 62. Accordingly, if the first electrode plate 50 and the wiring substrate 60 have moved in such a direction that they would separate from each other, either each engaging portion 45 and each opening portion 26 interfere with each other or the outer side surface of the protruding portion 52 or the grappling portion 54 and the inner side surface of the intrusion opening 62 interfere with each other. Due to this interference, they are stopped by each of the side surfaces in the horizontal direction, that is, the surface direction of the jointing surface 52a and by the engaging portions 45 and the opening portions 26 in a direction perpendicular to the jointing surface 52. This prevents the wiring substrate 60 from separating from the first electrode plate 50.

Note that the semiconductor device 10, the first electrode plate 50, the second electrode plate 30, and the wiring substrate 60 are jointed using the solder member B and engaged using the engaging portions 45 and the opening portions 26 as in the case of the semiconductor package 1 according to the first embodiment. Thus, the semiconductor package 1A is formed as shown in FIG. 12.

In the thus constituted semiconductor package 1A, the wiring substrate 60 can be mounted to the first electrode plate 50 by sliding the wiring substrate 60 without the need of pressuring it in particular so that the engaging portions 45 and the opening portions 26 may be engaged with each other. Further, when having been slid, the elastically deformed wiring substrate 60 is restored to its original planar shape owing to its restoring force, so that the first electrode 50 and the wiring substrate 60 are mounted to each other automatically. It is thus possible to easily mount the first electrode plate 50 and the wiring substrate 60 to each other.

Further, since a plurality of the pedestal portions 53 are formed in a direction perpendicular to the sliding direction, even if the wiring substrate 60 has been slid, the tip portion 64 of the projecting portion 63 is always securely placed on the pedestal portions 53. That is, if the pedestal portions have been formed in the sliding direction of the wiring substrate 60, there is a possibility that the tip portion 64 may not be placed on the pedestal portions before sliding, thus flexing downward owing to its own weight. If the wiring substrate 60 is slid in this condition, there is a possibility that the tip surface of the tip portion 64 and the side surface of the pedestal portion may abut against each other.

If the wiring substrate 60 is slid further in this condition, a load is applied to the projecting portion 63 in the sliding direction, so that there is a possibility that the projecting portion 63 may be deformed elastically or plastically and the control electrode 49 may not be positioned at a predetermined position. This shift in position of the control electrode 49 may bring about poor jointing, poor contact, etc. when the semiconductor package 1A is assembled. Therefore, in the semiconductor package 1A, by providing a plurality of the pedestal portions 53 in the direction perpendicular to the sliding direction, the tip portion 64 can always be securely held and guided, thereby preventing poor jointing.

As described above, in the semiconductor package 1A according to the second embodiment, the same effects as the semiconductor package 1 can be obtained and, moreover, the first electrode plate 50 and the wiring substrate 60 can be mounted to each other more easily solely by sliding the wiring substrate 60. It is thus possible to reduce the number of manufacturing (assembling) processes and the manufacturing costs of the semiconductor package 1A.

Next, a semiconductor package 1B according to a variant of the invention will be described below with reference to FIG. 13.

Figure 13:
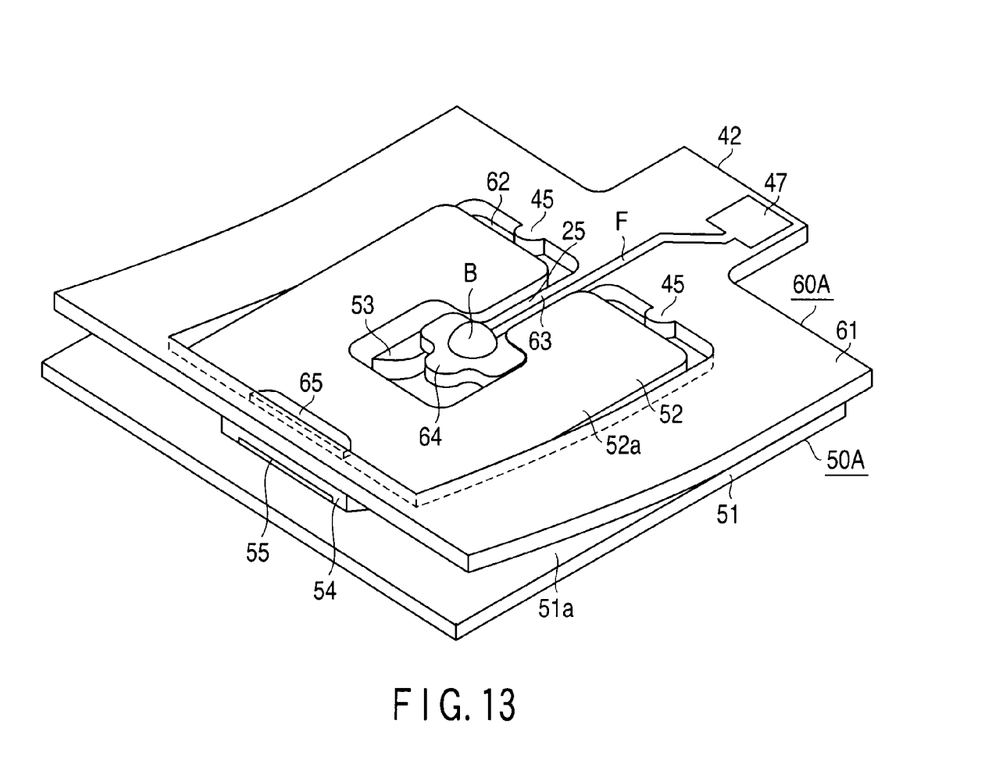
FIG. 13 is a perspective view of one example of assembling a first electrode plate and a wiring substrate which are used in a semiconductor package according to a variant of the invention.

FIG. 13 is a perspective view of one example of assembling a first electrode plate 50A and a wiring substrate 60A which are used in a semiconductor package 1B according to a variant of the invention. Note that in FIG. 13, components having the same functions as those in FIGS. 1 to 12 are indicated by the same symbols and their detailed explanation will not be repeated here.

The semiconductor package 1B includes a semiconductor device 10, a first electrode plate 50A provided on the side of a first main surface 11, a second electrode plate 30 provided on the side of a second main surface 12, and a wiring substrate 60A provided between the semiconductor device 10 and the first electrode plate 50A.

A grappling portion 54 has at least one opening portion 55 in its side surface covered with an intrusion opening portion 62. The intrusion opening portion 62 has an engaging portion 65 which can be engaged with the opening portion 55.

Next, a method of manufacturing such a semiconductor package 1B will be described below with reference to FIG. 13.

As shown in FIG. 13, first, as in the case of the above-described semiconductor package 1A, the wiring substrate 60A is slid in such a direction as to separate the inner side surface of the intrusion opening portion 62 from such an outer side surface of a protruding portion 52 as to have the grappling portion 54 thereon, that is, a direction in which the engaging portion 45 is engaged with an opening portion 26. By sliding this wiring substrate 60A, the engaging portion 45 and the opening portion 26 are engaged with each other.

When the wiring substrate 60A is being slid in such a manner, the lower surface of the engaging portion 65 abuts against the upper surface of the grappling portion 54, so that the wiring substrate 60A (insulating substrate 61) is bent (deformed elastically) by as much as the thickness of the grappling portion 54.

The periphery of the engaging portion 65 of the wiring substrate 60A is pressured to deform the engaging portion 65 elastically. Note that the periphery of the engaging portion 65 of the wiring substrate 60A may be bent in such a manner that the engaging portion 65 may face a first substrate body 51. That is, by elastically deforming the engaging portion 65 or its periphery, the engaging portion 65 is caused to be engaged with the opening portion 55.

Further, since the sliding-directional length of the intrusion opening portion 62 is adjusted so as to be approximately equal to a total of the length of the protruding portion 52 and the grappling portion 54, if the engaging portions 45 and 65 are engaged with the opening portions 26 and 55 respectively, the side surface of the grappling portion 54 abuts against the inner side surface of the intrusion opening 62. Further, the lower surface of the wiring substrate 60A abuts against one surface 51a of the first electrode plate 50A.

If the engaging portions 45 and 65 have been engaged with the opening portions 26 and 55 respectively so that the lower surface of the wiring substrate 60A may abut against the upper surface of the first electrode plate 50A, the outer surfaces of the engaging portions 45 and 65 are covered with the opening portions 26 and 55 respectively. Further, the side surfaces of the protruding portion 52 and the grappling portion 54 are covered with the inner peripheral surface of the intrusion opening portion 62. Accordingly, if the first electrode plate 50 and the wiring substrate 60 have moved in such a direction that they would separate from each other, either each of the engaging portions 45 and 65 and each of the opening portions 26 and 55 interfere with each other respectively or the outer surface of the protruding portion 52 or the grappling portion 54 and the inner side surface of the intrusion opening portion 62 interfere with each other. Due to this interference, they are stopped by each of the side surfaces in the horizontal direction, that is, the surface direction of the jointing surface 52a. Further, they are stopped by the engaging portions 45 and 65 and the opening portions 26 and 55 in a direction perpendicular to the jointing surface 52*a*. This prevents the wiring substrate 60A from separating from the first electrode plate 50A.

Note that as in the case of the semiconductor package 1 according to the above-described first embodiment, the semiconductor device 10, the first electrode plate 50, the second electrode plate 30, and the wiring substrate 60 are jointed using a solder member B and engaged using the engaging portion 45 and the opening portion 26, thereby forming the semiconductor package 1B.

In the thus constituted semiconductor package 1B, the wiring substrate 60A can be mounted to the first electrode plate 50A by sliding the wiring substrate 60 so that the engaging portion 45 and the opening portion 26 may be engaged with each other. Further, it is mounted to the opening portion 55 by the elastically deformed engaging portion 65 or its periphery. It is thus possible to easily mount the first electrode plate 50A and the wiring substrate 60A to each other and also to engage them with each other at two positions where the engaging portions 45 and 65 face the opening portions 26 and 55 respectively. This prevents the first electrode plate 50A and the wiring substrate 60A from separating from each other.

Further, since the side surfaces of the protruding portion 52 and the grappling portion 54 are covered with the inner side surface of the intrusion opening 62 and, moreover, the first electrode plate 50A and the wiring substrate 60A are engaged using the engaging portions 45 and 65 and the opening portions 26 and 55 respectively, the first electrode plate 50A and the wiring substrate 60A will interfere with each other in each of the directions. It is thus possible to mount the first electrode plate 50A and the wiring substrate 60A to each other securely.

As described above, in the semiconductor package 1B according to the variant, similar effects as the semiconductor packages 1 and 1A can be obtained and, moreover, the first electrode plate 50A and the wiring substrate 60A can be mounted to each other securely by arranging the first electrode plate 50A and the wiring substrate 60A in such a manner that they may reliably interfere with each other in each of the directions.

Note that the invention is not limited to the above embodiments. Although in the above-described examples the material of the first electrode plates 20 and 50 and the second electrode plate 30 in the semiconductor packages 1 and 1A, for example, has been copper, the invention is applicable even if the material is, for example, aluminum, molybdenum, copper molybdenum alloy, copper tungsten alloy, etc. as long as it is conductive. Further, various materials other than those of the first electrode plates 20 and 50 and the second electrode plate 30 may be cladded or plated, thus giving conductivity where required.

Further, the solder member B may be any solder member such as Sn—Pb eutectic solder, lead-free solder, or Pb-rich high-temperature solder. Further, a spacer may be formed between the second electrode plate 30 and the insulating substrates 40 and 60 and outside the outer peripheral edge of the semiconductor device 10. By providing the spacer, it is possible to maintain a constant distance between the second electrode plate 30 and the insulating substrates 40 and 60, thereby preventing the semiconductor device 10 from being damaged by an external force.

Further, although the through-hole 23 has been formed in the protruding portions 22 and 52 and one or a plurality of the pedestal portions 24 and 53 have been provided on the inner surface of the through-hole 23 in the other surfaces 21*b* and 51*b* of the first electrode plates 20 and 50 respectively, the pedestal portions 24 and 53 may be replaced by any other component. Further, the through-hole 23 need not be formed. That is, the invention can be made applicable also by providing the protruding portions 22 and 52 with a communicating path and a recess in which the protruding portions 44 and 63 and the tip portions 48 and 64 can be disposed respectively. Furthermore, the length of each of the protruding portions 44 and 63 and the positions (layouts), etc. of the various electrodes 13 and 14 can be set appropriately.

Further, although the above-described semiconductor packages 1 and 1A have each had the opening portions 26 and the engaging portions 45 as many as two each for each side surface of the protruding portions 22 and 52 or for one of the side surfaces thereof, the number thereof is not limited to two. Further, the opening portion 26 and the engaging portion 45 may each have any shape, as long as they can be engaged with each other.

Further, although the above-described semiconductor package 1 has had the opening portion 26 formed in the outer side surfaces of the protruding portion 22 that faces each other via the through-hole 23, the opening portion may be formed in any other side surface. Similarly, the semiconductor package 1A may also have the opening portion 26 formed in any other outer side surface of the protruding portion 52. Note that in this case, the engaging portion 45 is to be formed on the inner surface of each of the intrusion opening portions 43 and 62 where it corresponds to each of the opening portions 26.

The invention is not limited to the precise forms disclosed, and modifications of the components may be possible for practical application without departing from the gist of the invention. Further, various inventions can be obtained by appropriately combining a plurality of the components disclosed in the above embodiments. For example, some of the components given in the embodiments may be omitted. Further, the components in the different embodiments may be combined appropriately.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor package comprising:

a plate-shaped semiconductor device having a gate electrode provided at a midsection of a first main surface, an emitter electrode provided around the gate electrode on the first main surface, and a collector electrode provided on a second main surface;

a plate-shaped first electrode plate having a protruding portion which is provided on one of surfaces facing the first main surface and which abuts against at least part of the emitter electrode, a through-hole formed at a center of the protruding portion, a pedestal portion which forms part of an inner peripheral surface of the through-hole and which is provided on the other surface side, a communication path formed in the protruding portion and extending from the through-hole up to an outer side surface of the protruding portion, and a plurality of opening portions formed in the outer side surface of the protruding portion;

a wiring substrate stacked between the semiconductor device and the first electrode plate, formed like a plate which can be sandwiched, and having an intrusion opening portion into which the protruding portion is intruded, a projecting portion whose base end is provided on an inner peripheral surface of the intrusion opening portion, whose tip is positioned within the through-hole and held on the pedestal portion, and which extends through the communicating path, a control electrode provided on the tip of the projecting portion and electrically connected to the gate electrode, and a plurality of engaging portions which are formed in the inner peripheral surface of the intrusion opening portion and engaged with said plurality of opening portions and whose tips are positioned inside the outer side surface of the protruding portion; and a plate-shaped second electrode whose one main surface is electrically connected to the collector electrode.

2. The semiconductor package according to claim 1, wherein at least some of said plurality of opening portions are formed in the outer side surfaces that face each other via the protruding portion.

* * * * *